United States Patent
Ohta et al.

(10) Patent No.: US 6,177,841 B1
(45) Date of Patent: Jan. 23, 2001

(54) HIGH FREQUENCY POWER AMPLIFIER

(75) Inventors: Akira Ohta; Akira Inoue; Tetsuya Heima, all of Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/258,069

(22) Filed: Feb. 26, 1999

(30) Foreign Application Priority Data

Sep. 28, 1998 (JP) .................................................. 10-273668

(51) Int. Cl.[7] .................................................. H03F 3/191
(52) U.S. Cl. .................................................. 330/302; 330/306
(58) Field of Search .................................. 330/302–306, 330/65–68

(56) References Cited

U.S. PATENT DOCUMENTS

| | | | |
|---|---|---|---|
| 4,717,884 | * | 1/1988 | Mitzlaff .................................. 330/277 |
| 4,772,856 | * | 9/1988 | Nojima et al. ........................ 330/306 |
| 5,146,178 | * | 9/1992 | Nojima et al. ........................ 330/306 |
| 5,274,341 | * | 12/1993 | Sekine et al. ......................... 330/306 |
| 5,347,229 | * | 9/1994 | Suckling et al. ...................... 330/306 |
| 5,352,990 | * | 10/1994 | Goto ..................................... 330/305 |
| 5,434,540 | * | 7/1995 | Yamamoto et al. .................. 330/306 |
| 5,473,281 | | 12/1995 | Honjo ................................... 330/302 |

FOREIGN PATENT DOCUMENTS

| | | |
|---|---|---|
| 63-204912 | 8/1988 | (JP) . |
| 8-37433 | 2/1996 | (JP) . |
| 8-130424 | 5/1996 | (JP) . |
| 9-246889 | 9/1997 | (JP) . |

* cited by examiner

*Primary Examiner*—Robert Pascal
*Assistant Examiner*—Khanh Van Nguyen
(74) *Attorney, Agent, or Firm*—Leydig, Voit & Mayer, Ltd.

(57) ABSTRACT

A high frequency power amplifier with reduced power loss and improved power amplification efficiency has an output matching circuit providing an open circuit to a second harmonic and a short circuit to a third harmonic of a high frequency signal. This is accomplished by, for example, adjusting lengths of a drain bias line and a plurality of signal lines so that the phase of S parameter S11 (input reflection coefficient) to the second harmonic is from −80° to 140°, and the phase of S parameter S11 to the third harmonic is from 160° to 220°. The line length of each line in an input matching circuit is also adjusted so that the phase of S parameter S22 (output reflection coefficient) at the fundamental frequency is between +5° to −75°.

20 Claims, 14 Drawing Sheets

HIGH FREQUENCY POWER AMPLIFIER

BACKGROUND OF THE INVENTION

1. Field of the Invention

The present invention relates to a semiconductor amplifier comprising, for example, field-effect transistors or bipolar transistors for high frequency amplification, and relates more specifically to a high efficiency amplifier used, for example, in mobile communications devices and microwave band communications devices.

2. Description of the Related Art

B-class amplifiers are commonly used for high frequency power amplifiers in mobile communications devices and microwave band communications devices.

A typical B-class amplifier circuit according to the related art is shown in FIG. 26. As shown in FIG. 26, the source of field-effect transistor (FET) 201 in this amplifier is grounded. A drain bias voltage is applied to the drain of FET 201 via a drain bias line 204 from a drain bias power supply terminal 203, and a capacitor 202 is inserted between the ground and drain bias power supply terminal 203. A high frequency signal to be amplified is input to the gate of FET 201 from a signal input terminal 205. The signal amplified by FET 201 is output through a fundamental wave matching circuit 206 from a signal output terminal 207. In this B-class amplifier, the gate bias point of the FET 201 is set so that the dc drain current goes to zero.

FIG. 27 is a graph showing the waveforms of the drain current and drain voltage in the FET 201 shown in FIG. 26. The drain voltage is indicated by a solid line in FIG. 27, and the drain current is indicated by a dotted line. Note that the drain voltage has a sine wave shaped waveform, and the drain current has a half-wave rectified waveform. Note, further, that the shaded area indicates power loss.

As will be known from FIG. 27, a problem with an amplifier as shown in FIG. 26 is that power loss occurs, and efficiency therefore drops, when the drain current is greater than zero and the drain voltage is also greater than zero.

It should be further noted that high harmonic processing wherein even harmonics are short circuited and odd harmonics are open circuited is taught in Japanese Patent Laid-Open Publication Nos. 7-94974, 8-130424, and 9-246889.

An FET mixer comprising a low pass filter connected between an FET and IF band matching circuit is also taught in Japanese Patent Laid-Open Publication No. 2-94908.

SUMMARY OF THE INVENTION

An object of the present invention is therefore to provide a high frequency power amplifier directed to the above-noted problems and specifically capable of reducing power loss and thereby improving operating efficiency.

To achieve the aforementioned object, a high frequency power amplifier for amplifying a high frequency signal according to the present invention comprises an amplifier element for amplifying a high frequency signal, and an output matching circuit for impedance matching the high frequency signal output from an output terminal of said amplifier element. The output matching circuit provides a sufficiently low impedance shorting load to odd harmonics other than the fundamental wave in the high frequency signal, and a sufficiently high impedance open load to even harmonics.

The output matching circuit in an amplifier according to the present invention is comprised so that impedance to odd harmonics is sufficiently low, and impedance to even harmonics is sufficiently high. Power loss can thus be reduced while improving power amplification efficiency.

A high frequency power amplifier according to the present invention further preferably comprises an input matching circuit for impedance matching to a high frequency signal input to an input terminal of the amplifier element. In this case, the reflection coefficient of the input matching circuit seen from the input terminal of the amplifier element is preferably set so that a phase angle of a fundamental wave on a polar chart is within +5° to −75° of a phase angle at which maximum gain is obtained. In other words, the line length of each line in the input matching circuit is adjusted so that the phase of S parameter S22 (output reflection coefficient) to the fundamental wave is between +5° to −75° of the position at which maximum gain is achieved.

The output impedance matching circuit of the invention is further preferably comprised to impedance match each harmonic in sequence from a high order harmonic of a high frequency signal amplified by the amplifier element. As a result, it is possible to increase reflection of high order harmonics, which tend to contribute to increased loss, and decrease phase change in high order harmonics, which also tend to increase phase change in band.

The output matching circuit of the present invention yet further preferably comprises an odd harmonic matching circuit for creating a short circuit load to at least one odd harmonic of a high frequency signal amplified by the amplifier element; an even harmonic matching circuit for creating an open circuit load to at least one even harmonic of the high frequency signal; and a fundamental wave matching circuit for impedance matching to a fundamental wave of the high frequency signal. In this case, the matching circuits are preferably connected from the output terminal of the amplifier element in sequence from the highest order harmonic to which impedance matching is applied.

With this configuration it is not necessary to consider harmonics of an order higher than the harmonic that is impedance matched by each matching circuit. As a result, matching circuit design is simplified. It is also possible to increase reflection of high order harmonics, which tend to contribute to increased loss, and decrease phase change in high order harmonics, which also tend to increased phase change in band.

Further preferably, the reflection coefficient of the odd harmonic matching circuit is set so that a phase angle of an odd harmonic observed on a polar chart is in the range 160° to 220° when the output matching circuit is seen from the output terminal of the amplifier element.

In this case, the odd harmonic matching circuit further preferably comprises a bias line for supplying a bias voltage from an external source to the amplifier element output terminal, and the length of this bias line is set so that a phase angle of the odd harmonic is a desired value.

The output matching circuit further preferably comprises a low pass filter disposed between each matching circuit. When designing the odd harmonic matching circuit, even harmonic matching circuit, and fundamental wave matching circuit in this case, it is not necessary to consider harmonics of an order higher than that impedance matched by the specific matching circuit. Matching circuit design and adjustment are thus simple.

The odd harmonic matching circuit further preferably comprises at least one resonance circuit of a capacitor and parasitic inductor where the resonance circuit resonates at a frequency of an odd harmonic. In this case, impedance to an odd harmonic when the output matching circuit is seen from the amplifier element can be set to a desired value near zero. If the odd harmonic matching circuit comprises a plurality of resonance circuits, high efficiency operation can be achieved over a wide band.

Yet further preferably, the capacitor of the resonance circuit is disposed proximally to the amplifier element output terminal. As a result, a low inductance parasitic inductor and a high capacitance capacitor can be used in the resonance circuit of the odd harmonic matching circuit. As a result, high efficiency operation can be achieved over a wide band.

The even harmonic matching circuit further preferably comprises at least one resonance circuit of a capacitor and parasitic inductor where the resonance circuit resonates at a frequency of an even harmonic, and a signal line for connecting this resonance circuit and the odd harmonic matching circuit. In this case, the range of high efficiency operation with even harmonics is wide even when a low capacitance capacitor is used in the resonance circuit of the even harmonic matching circuit. As a result, the capacitance of the resonance circuit capacitor can be selected so that the impedance to the fundamental wave from the amplifier element to the output matching circuit can be easily set to a desired level.

The output matching circuit in this case further preferably comprises a bias line for supplying a bias voltage from an external source to the amplifier element output terminal. The length of this bias line and the length of the signal line of the even harmonic matching circuit are then set so the output impedance of the amplifier element, that is, the impedance from the amplifier element to the output matching circuit, to an even harmonic is a sufficiently high value near the open circuit level. As a result, the impedance to even harmonics from the amplifier element to the output matching circuit can be set to a sufficiently high value near the open circuit impedance.

In a preferred embodiment of the present invention, the inductance of a parasitic inductor of a resonance circuit in the even harmonic matching circuit is greater than the inductance of a parasitic inductor of a resonance circuit in the odd harmonic matching circuit. Impedance matching by the output matching circuit is thereby made easier.

A high frequency power amplifier according to the present invention can be further comprised with the amplifier element disposed to a semiconductor substrate, the output matching circuit is disposed to a multiple layer matching substrate, and a capacitor of the resonance circuit connected to a grounded ground electrode layer of the matching substrate through a via. A short signal line can therefore be used for grounding the resonance circuit capacitor, and a low inductance parasitic inductor can be used in the resonance circuit.

Alternatively, the amplifier element can be disposed to a semiconductor substrate, the output matching circuit disposed to a multiple layer matching substrate, and a capacitor of the resonance circuit connected to a grounded ground electrode layer of the matching substrate only by means of a conductor layer formed on a side of the matching substrate.

The capacitor of the resonance circuit in this case can further alternatively be disposed to a semiconductor substrate on which the amplifier element is formed. The capacitor can thus be made smaller compared with a discrete capacitor chip. As a result, the parasitic inductance of the capacitor can be reduced, the capacitance of the resonance circuit capacitor can be increased, and high efficiency operation over a wide band can be achieved.

The fundamental wave matching circuit can be achieved with a low pass filter. In this case, the length of the signal line providing the inductance of the low pass filter can be shortened as the capacitance of the resonance circuit capacitor is decreased, and the substrate area occupied by the fundamental wave matching circuit can therefore be reduced.

Alternatively, the fundamental wave matching circuit can comprise a low pass filter and a resonance circuit with the resonance circuit resonating at a frequency of an even harmonic or an odd harmonic. In this case, the length of the signal line providing the inductance of the low pass filter can be shortened as the capacitance of the resonance circuit capacitor is decreased, the substrate area occupied by the fundamental wave matching circuit can therefore be reduced, and the level of harmonics output from the matching circuit can be lowered.

In any of the various versions of the present invention described above the even harmonic is preferably the second harmonic, and the odd harmonic is preferably the third harmonic. As a result, impedance to the third harmonic can be made sufficiently low, impedance to the second harmonic can be made sufficiently high, and power loss can therefore be decreased by improving efficiency.

BRIEF DESCRIPTION OF THE DRAWINGS

These and other objects and features of the present invention will be readily understood from the following detailed description taken in conjunction with preferred embodiments thereof with reference to the accompanying drawings, in which like parts are designated by like reference numerals and in which.

DESCRIPTION OF THE PREFERRED EMBODIMENTS

The preferred embodiments of the present invention are described below with reference to the accompanying figures.
Embodiment 1

Figure 1:
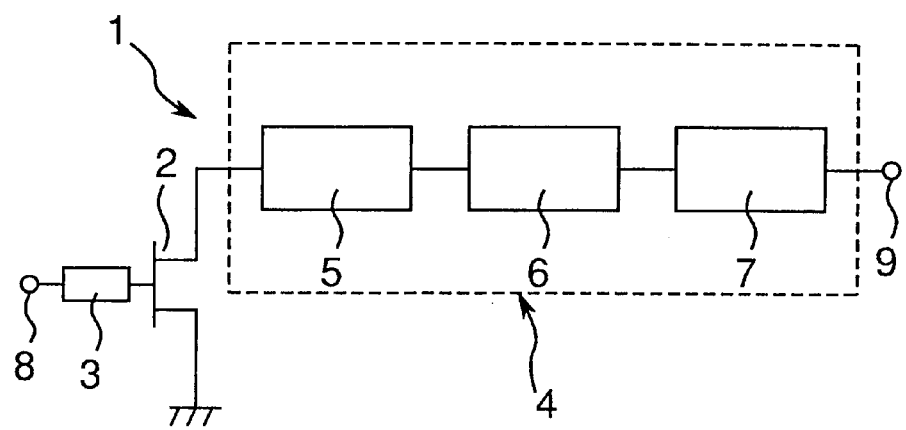
FIG. 1 is a block diagram of a high frequency power amplifier according to a first embodiment of the present invention.
Figure 2:
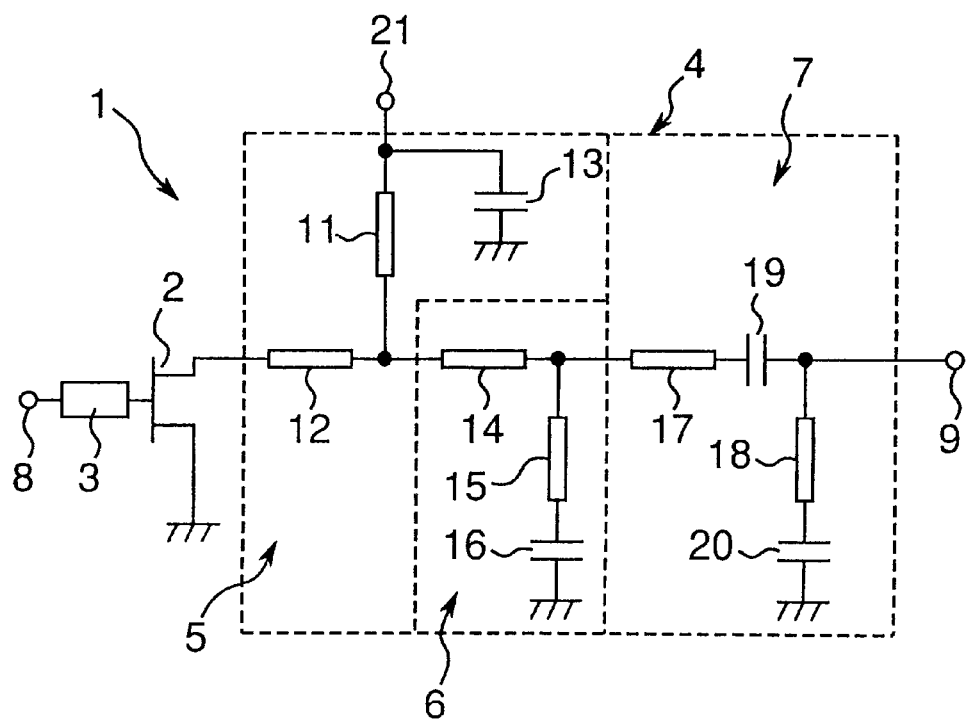
FIG. 2 is a circuit diagram of the high frequency power amplifier shown in FIG. 1.

FIG. 1 is a typical block diagram of a high frequency power amplifier according to a first embodiment of the present invention, and FIG. 2 is a circuit diagram of the high frequency power amplifier shown in FIG. 1. It should be noted here that the high frequency power amplifier 1 shown in FIG. 1 and FIG. 2 is described below using, by way of example only, a high frequency power amplifier having a GaAs field-effect transistor (FET).

As shown in FIG. 1 and FIG. 2, a high frequency power amplifier 1 according to this preferred embodiment of the invention comprises a FET 2, input matching circuit 3, and output matching circuit 4.

The output matching circuit 4 comprises a third harmonic matching circuit (odd harmonic matching circuit) 5 for impedance matching the third harmonic (odd harmonic) of the FET 2 output; a second harmonic matching circuit (even harmonic matching circuit) 6 for impedance matching the second harmonic (even harmonic) of the FET 2 output; and a fundamental wave matching circuit 7 for impedance matching the fundamental wave.

The input matching circuit 3 is inserted between a signal input terminal 8 and the gate of the FET 2. An external high frequency signal is thus input from signal input terminal 8 through the input matching circuit 3 to the gate of FET 2. The drain of the FET 2 is connected to the third harmonic matching circuit 5, and the source is connected to ground. The third harmonic matching circuit 5 is connected to the second harmonic matching circuit 6, and the second harmonic matching circuit 6 is connected to the fundamental wave matching circuit 7. The fundamental wave matching circuit 7 is connected to a signal output terminal 9 from which the amplified high frequency signal is output.

The third harmonic matching circuit 5 comprises a drain bias line 11, signal line 12, and capacitor 13. The second harmonic matching circuit 6 comprises signal lines 14 and 15, and capacitor 16. The fundamental wave matching circuit 7 comprises signal lines 17 and 18, and capacitors 19 and 20. A drain bias voltage is supplied from an external source through the drain bias supply terminal 21.

Drain bias line 11 and signal line 12 are connected in series in the third harmonic matching circuit 5 between the drain of FET 2 and the drain bias supply terminal 21, and capacitor 13 is connected between the drain bias supply terminal 21 and ground.

In the second harmonic matching circuit 6, signal line 14, signal line 15, and capacitor 16 are connected in series between ground and a node between the drain bias line 11 and signal line 12 of the third harmonic matching circuit 5.

In the fundamental wave matching circuit 7, the signal line 17 and capacitor 19 are connected in series of the signal output terminal 9 and a node between the signal line 14 and signal line 15 of the second harmonic matching circuit 6; signal line 18 and capacitor 20 are connected in series between the signal output terminal 9 and ground.

Figure 3:
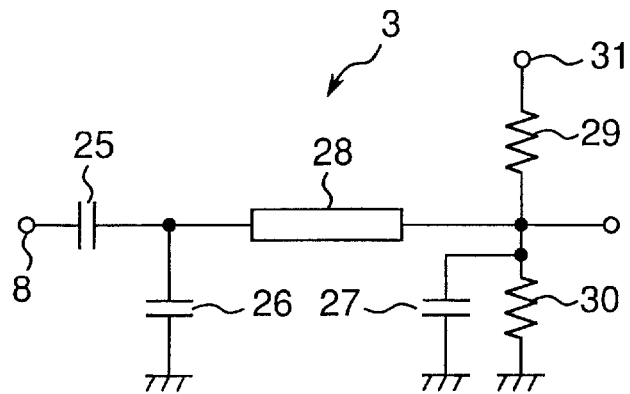
FIG. 3 is a circuit diagram of the input matching circuit 3 shown in FIG. 1 and FIG. 2.

FIG. 3 is a circuit diagram of the input matching circuit 3 shown in FIG. 1 and FIG. 2.

As shown in FIG. 3, the input matching circuit 3 comprises capacitors 25, 26, and 27, signal line 28, and resistors 29 and 30. In the input matching circuit 3, a series circuit of capacitor 25 and signal line 28 is connected between signal input terminal 8 and the gate of FET 2, and the node of capacitor 25 and signal line 28 is connected to ground through a capacitor 26. A series circuit of resistor 29 and resistor 30 is also connected between ground and the gate bias supply terminal 31 to which a gate bias voltage is applied from an external source. A node of resistor 29 and resistor 30 is connected to the gate of FET 2, and is also connected to ground through capacitor 27.

Thus comprised, the third harmonic matching circuit 5 adjusts the line length of the drain bias line 11 and signal line 12 so that the impedance to the third harmonic is a sufficiently low short circuit load. The second harmonic matching circuit 6 likewise adjusts the line length of signal lines 12, 14, and 15 so that the impedance to the second harmonic is a sufficiently high open load.

Figure 4A:
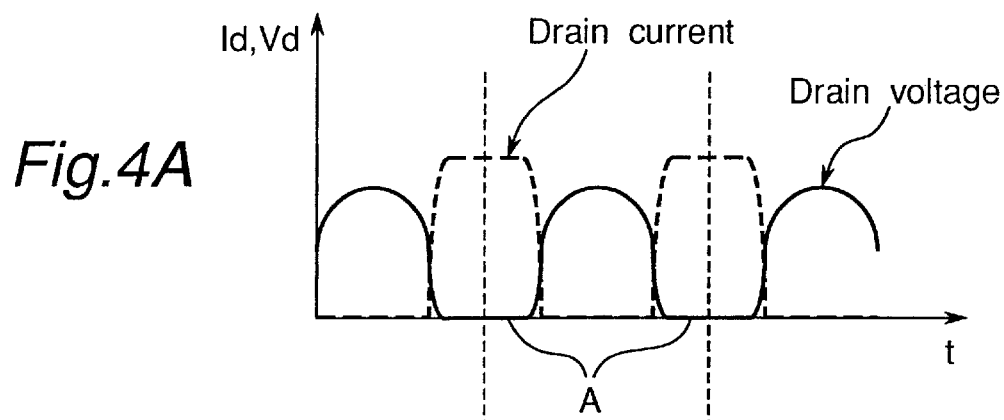
FIGS. 4A to 4C are waveform diagrams of signals at various points in the high frequency power amplifier 1 shown in FIG. 2.
Figure 4B:
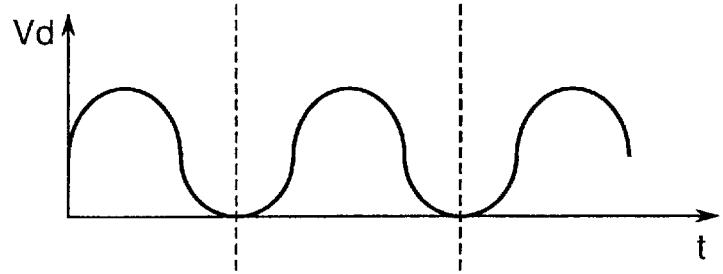
Figure 4C:
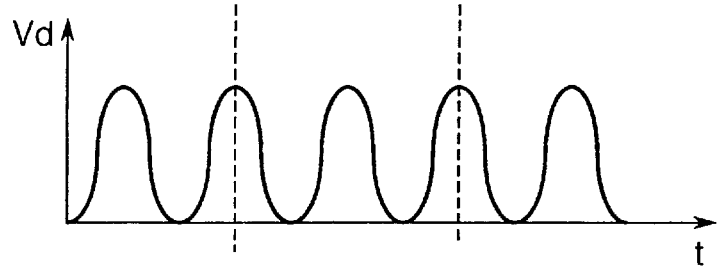

FIG. 4A is a waveform diagram of the drain voltage Vd and drain current Id of the FET 2, FIG. 4B shows the voltage waveform of the fundamental wave, and FIG. 4C shows the voltage waveform of the second harmonic. Note that in FIG. 4A the solid line waveform is indicative of the drain voltage, and the dotted line waveform is indicative of the drain current. As will be known from FIG. 4A, power loss is small because the drain current waveform approximates a square wave due to effects of the third harmonic, and the drain voltage waveform is similarly affected by the second harmonic, becoming flat as indicated by A in the figure. As a result, the power amplification efficiency of an amplifier 1 according to this preferred embodiment is improved.

Figure 5:
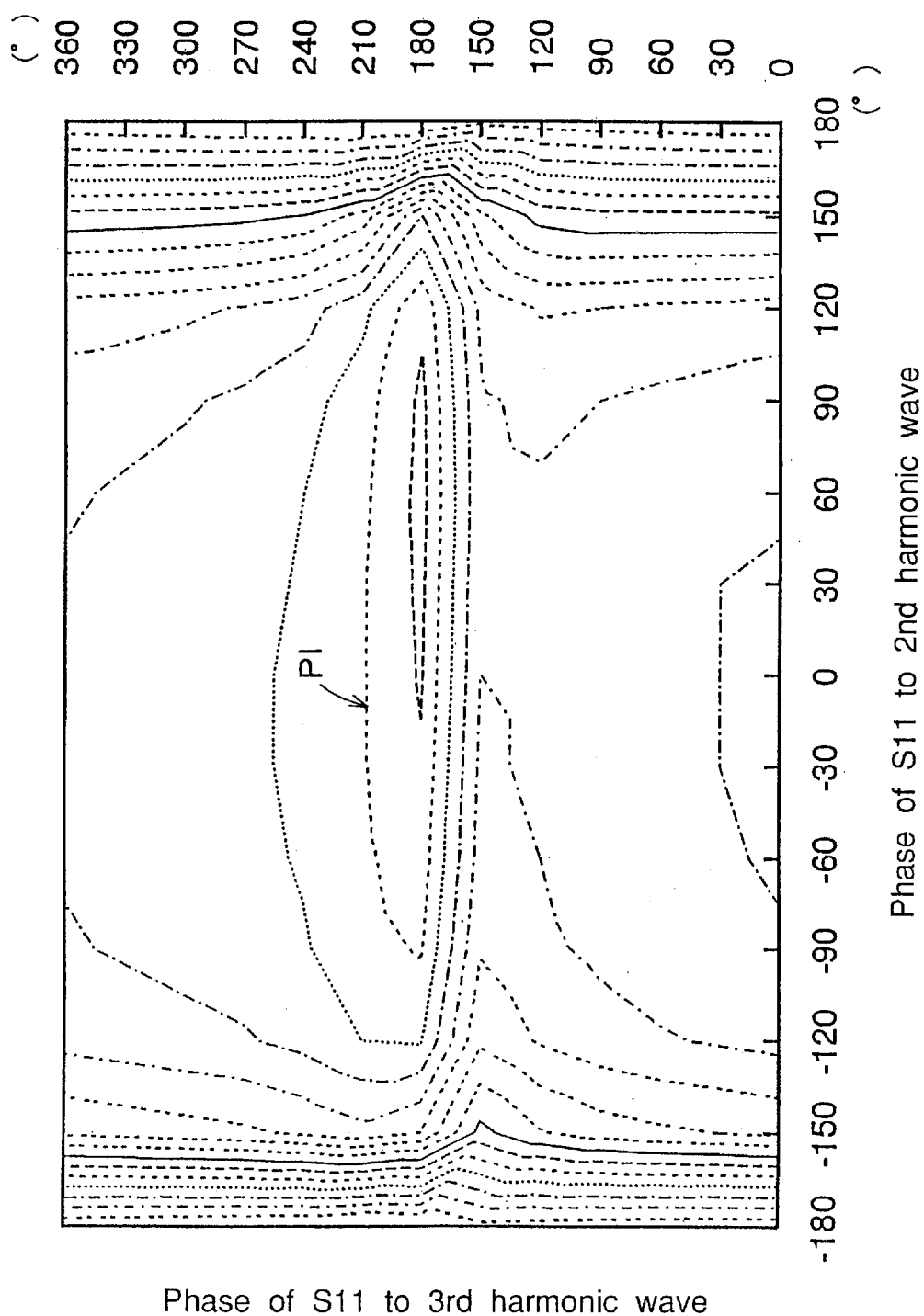
FIG. 5 shows the results of power amplification efficiency (PAE) simulation in which the phase of the second and third harmonics were changed.

FIG. 5 shows the simulated results of power amplification efficiency (PAE) to changes in the phase of the second harmonic and third harmonic waves using a 950 MHz fundamental wave frequency with the reflection coefficient Γout observed from the output of the FET 2 to the output matching circuit 4 side observed on a polar chart.

If the area inside line P1 is the area of high power amplification efficiency, it will be known from FIG. 5 that high amplification efficiency is possible when the phase of S parameter S11 (input reflection coefficient) to the second harmonic is from −90° to 130°, and the phase of S parameter S11 to the third harmonic is from 170° to 210°. When a tolerances of the device is taken into consideration, high power amplification efficiency is achieved in the case that the S11 parameter phase to the second harmonic is from −80° to 140°, and the S11 parameter phase to the third harmonic is from 160° to 220°.

The S11 parameter phase can be increased for the second harmonic wave by shortening the total line length, which is the sum of the line lengths of signal lines 12, 14, and 15, and the phase of the S11 parameter to the second harmonic wave can be adjusted to a value within the high efficiency range by adjusting the length of each of the signal lines 12, 14, and 15.

The phase of S parameter S11 to the third harmonic can also be adjusted to a value within the high power amplification efficiency range by adjusting the lengths of drain bias line 11 and signal line 12. For example, the simulation results show that by shortening the combined line length of drain bias line 11 and signal line 12 by 1 mm, the phase of S11 to the third harmonic can be increased 10° to 30°. It should be noted that loss from multiple reflections of the fundamental wave can be decreased by shortening the line length of signal line 12, and the length of this signal line 12 is therefore preferably as short as possible.

Figure 6:
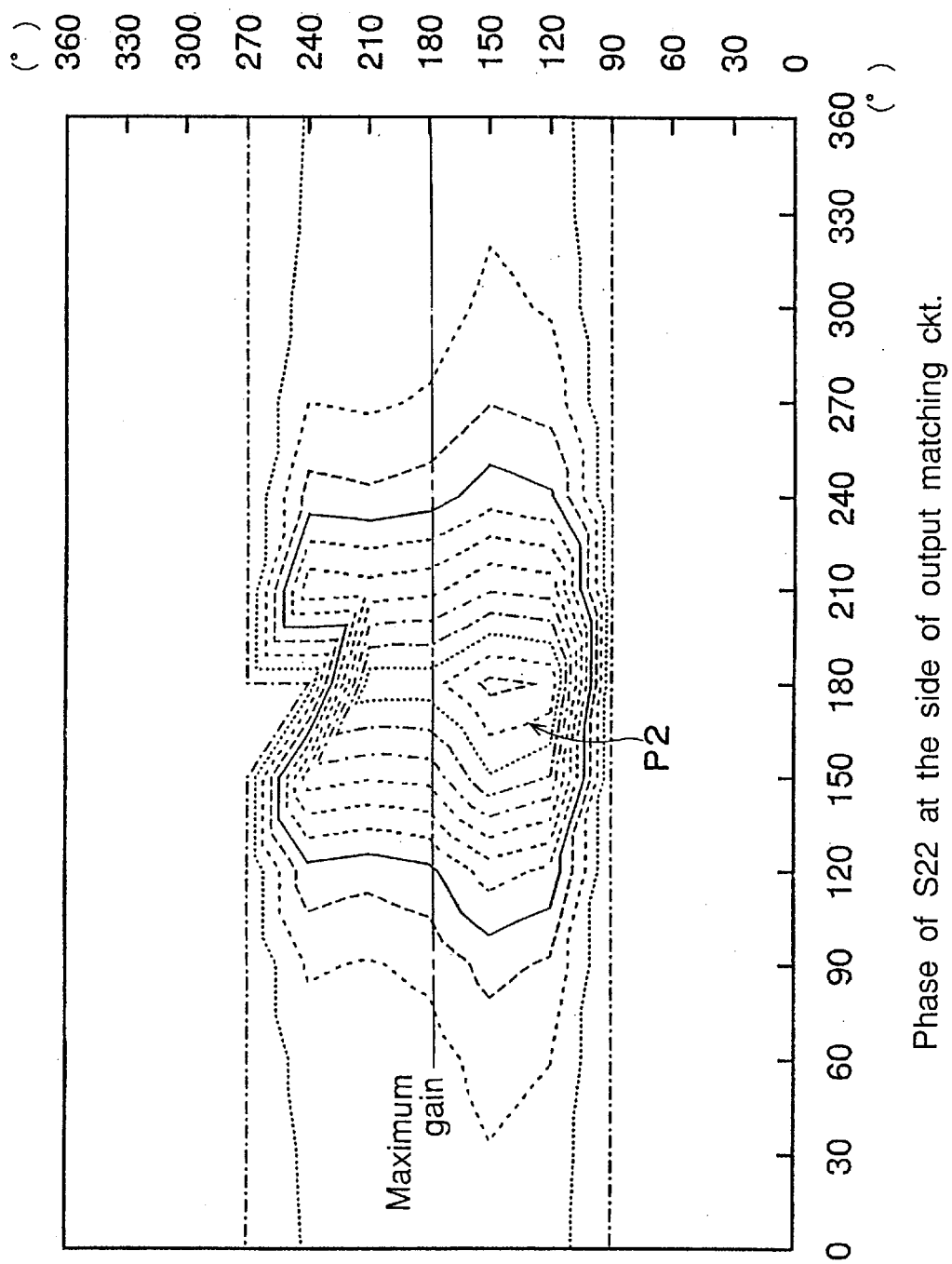
FIG. 6 shows the results of power amplification efficiency (PAE) simulations in which the reflection coefficient Γin observed from the input terminal of the FET 2 to the input matching circuit 3 side, and the reflection coefficient Γout observed from the output terminal of the FET 2 to the output matching circuit 4, were changed.

FIG. 6 shows the results of power amplification efficiency simulations using a 950 MHz fundamental wave when the reflection coefficient Γin observed from the input terminal of the FET 2 to the input matching circuit 3, and the reflection coefficient Γout observed from the output terminal of the FET 2 to the output matching circuit 4, were changed.

By terminating to ground through capacitor 26 the input matching circuit 3, the S parameter S22 (output reflection coefficient) S parameter measured from the FET 2 is approximately 180° on a Smith chart. If the area within line P2 in FIG. 6 is the area of high power amplification efficiency, it is known from FIG. 6 that high efficiency is achieved when the phase of S parameter S22 for the fundamental wave on the input matching circuit 3 side observed from the FET 2 is from −5° to −65° of the gain matched phase achieving maximum gain (180° in FIG. 6), that is, between 115° to 175°.

Again considering a tolerances of the device, high efficiency is achieved when the S22 parameter to the fundamental wave on the signal source side is between +5° to −75° of the gain matched phase achieving maximum gain (180° in FIG. 6). The phase of S22 can be decreased by increasing the length of the signal line 28, and the phase of S parameter S22 to the fundamental wave on the signal source side can be adjusted to a value within the range of high power amplification efficiency by adjusting the line length of the signal line 28. For example, the phase of S22 can be decreased approximately 20° by increasing the line length of signal line 28 from approximately 0 mm to approximately 3 mm.

As thus described, a third harmonic matching circuit 5, second harmonic matching circuit 6, and fundamental wave matching circuit 7 are connected in sequence from the drain of the FET 2 for impedance matching with respect to a higher order harmonic that is easily affected by the electrical distance to the matching circuit. As a result, after each matching circuit it is not necessary to consider harmonics of an order higher than that to which impedance matching is applied by each matching circuit, and matching circuit design can thus be simplified. Reflection of high order harmonics, which easily increases loss, can also be increased, and the phase change of high order harmonics, the phase change of which increases easily in a given bandwidth, can be reduced.

Figure 7:
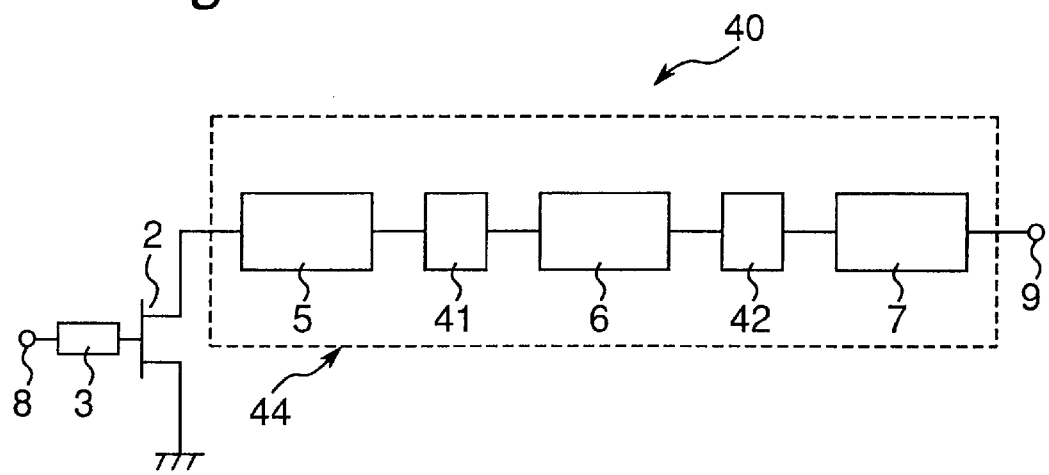
FIG. 7 is a block diagram of a high frequency power amplifier according to an alternative version of the first embodiment of the present invention shown in FIG. 1.
Figure 8:
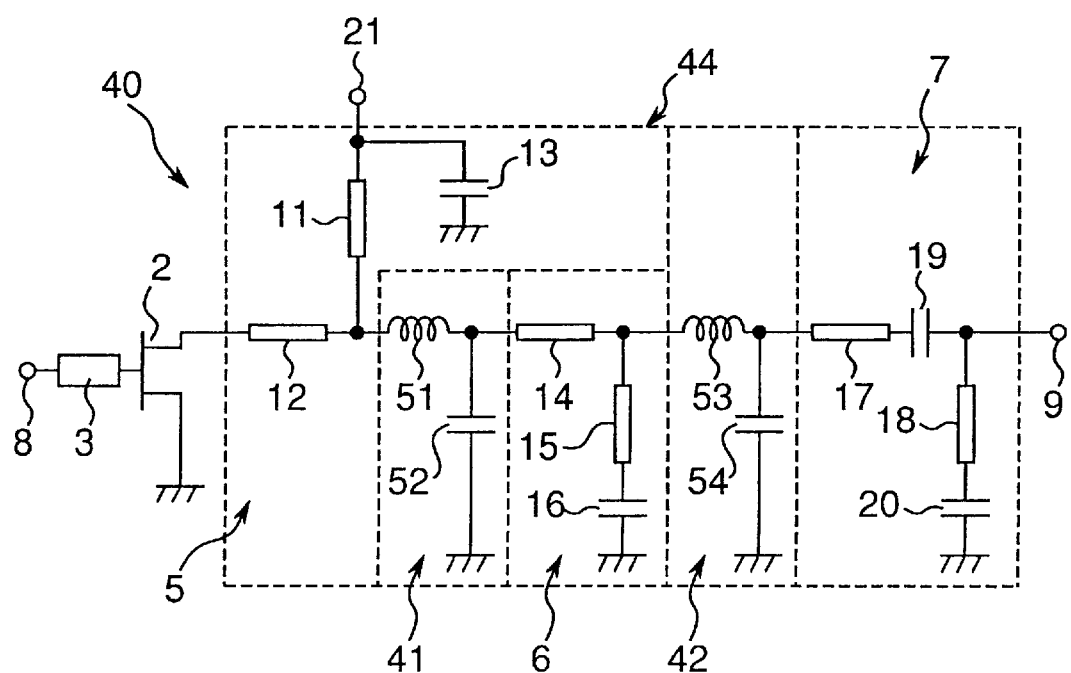
FIG. 8 is a circuit diagram of the high frequency power amplifier shown in FIG. 7.

FIG. 7 is a block diagram of an alternative version of a high frequency power amplifier according to the first preferred embodiment of the present invention described above. FIG. 8 is a circuit diagram of the high frequency power amplifier shown in FIG. 7.

The differences between the device shown in FIG. 7 and FIG. 8 and the device shown in FIG. 1 and FIG. 2 is that a low pass filter 41 comprising an inductor 51 and capacitor 52 is inserted between the third harmonic matching circuit 5 and second harmonic matching circuit 6, and a low pass filter 42 comprising an inductor 53 and capacitor 54 is inserted between the second harmonic matching circuit 6 and fundamental wave matching circuit 7. As a result, the output matching circuit 4 is indicated as output matching circuit 44, and the amplifier 1 as amplifier 40. As shown in FIG. 7 and FIG. 8, the high frequency power amplifier 40 comprises an FET 2, input matching circuit 3, and output matching circuit 44. The output matching circuit 44 comprises a third harmonic matching circuit 5, second harmonic matching circuit 6, fundamental wave matching circuit 7, and low pass filters 41 and 42.

The third harmonic matching circuit 5 is connected through low pass filter 41 to the second harmonic matching circuit 6, and the second harmonic matching circuit 6 is connected through low pass filter 42 to fundamental wave matching circuit 7.

In the third harmonic matching circuit 5, a series circuit of inductor 51 and capacitor 52, that is, low pass filter 41, is connected between ground and a node of the drain bias line 11 and signal line 12, and a node of inductor 51 and capacitor 52 is connected to the signal line 14 of the second harmonic matching circuit 6.

In the second harmonic matching circuit 6, a series circuit of inductor 53 and capacitor 54, that is, low pass filter 42, is connected between ground and a node of signal line 14 and signal line 15. A node of inductor 53 and capacitor 54 is connected to signal line 17 of the fundamental wave matching circuit 7.

In an output matching circuit 44 thus comprised, the inductor 51 and capacitor 52 of the low pass filter 41 are set to block the third and higher order harmonics, and the inductor 53 and capacitor 54 of low pass filter 42 are set to block the second harmonic. This makes it possible when designing the third harmonic matching circuit 5, second harmonic matching circuit 6, and fundamental wave matching circuit 7 to consider only the third harmonic in the design of the third harmonic matching circuit 5, only the second harmonic in the second harmonic matching circuit 6, and only the fundamental wave in the fundamental wave matching circuit 7. As a result, matching circuit design and adjustment are simplified.

It should be noted that this first preferred embodiment of the invention has been described with the third harmonic matching circuit 5, second harmonic matching circuit 6, and fundamental wave matching circuit 7 connected in sequence between the drain of FET 2 and the signal output terminal 9, but the invention is not be so limited. Specifically, the order of the third harmonic matching circuit 5 and second harmonic matching circuit 6 can be reversed, in which case the second harmonic matching circuit 6 is connected to the drain of FET 2, and the third harmonic matching circuit 5 is connected between the second harmonic matching circuit 6 and fundamental wave matching circuit 7.

As described hereabove, a high frequency power amplifier according to the first preferred embodiment of the present invention adjusts the line length of drain bias line 11 and signal lines 12, 14, and 15 so that the output matching circuit is an open load with respect to the second harmonic and a short-circuit load with respect to the third harmonic.

In addition, the line length of each line in the input matching circuit 3 is adjusted such that the phase of S parameter S22 to the fundamental wave is within +5° to −75° of the point at which maximum gain is obtained. As a result, power loss can be reduced and efficiency can be improved.

Furthermore, by providing a low pass filter 41 set to block third and higher order harmonics between the third harmonic matching circuit 5 and second harmonic matching circuit 6, and a low pass filter 42 set to block the second harmonic between the second harmonic matching circuit 6 and fundamental wave matching circuit 7 according to a further version of this first preferred embodiment, matching circuit design and adjustment are simplified.

Second embodiment

Figure 9:
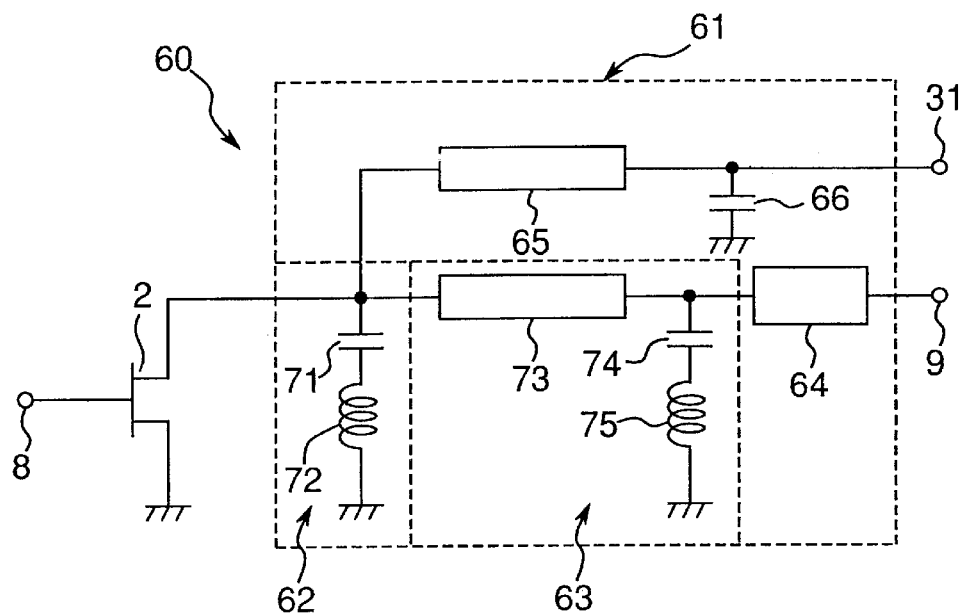
FIG. 9 is a circuit diagram of a high frequency power amplifier according to a second embodiment of the present invention.

FIG. 9 is a circuit diagram of a high frequency power amplifier according to a second preferred embodiment of the present invention.

It should be noted here that the high frequency power amplifier 60 shown in FIG. 9 is described below using, by way of example only, a high frequency power amplifier having a GaAs field-effect transistor (FET).

As shown in FIG. 9, a high frequency power amplifier 60 according to this preferred embodiment comprises a FET 2 and output matching circuit 61.

The output matching circuit 61 comprises a third harmonic matching circuit (odd harmonic matching circuit) 62 for impedance matching the third harmonic (odd harmonic) of the FET 2 output; a second harmonic matching circuit (even harmonic matching circuit) 63 for impedance matching the second harmonic (even harmonic) of the FET 2 output; a fundamental wave matching circuit 64 for impedance matching the fundamental wave; a drain bias line 65; and a capacitor 66.

The third harmonic matching circuit 62 in this embodiment comprises a capacitor 71 and inductor 72. The inductor 72 includes the parasitic inductance of the capacitor 71 and the parasitic inductances between the capacitor 71 and ground. The capacitor 71 and inductor 72 are connected in series and form a resonance circuit.

The second harmonic matching circuit 63 comprises a signal line 73, capacitor 74, and inductor 75. The inductor 75 includes the parasitic inductance of the capacitor 74 and the parasitic inductances between the capacitor 74 and ground. The capacitor 74 and inductor 75 are connected in series and form a resonance circuit.

The gate of the FET 2 is connected to the signal input terminal 8; the drain bias line 65 is connected between the drain and drain bias supply terminal 21; and the capacitor 66 is connected between ground and the drain bias supply terminal 21. A series circuit of the capacitor 71 and inductor 72 is connected between the drain of FET 2 and ground in the third harmonic matching circuit 62.

In the second harmonic matching circuit 63, a series circuit of capacitor 74 and inductor 75 is connected between the drain of FET 2 and ground with the signal line 73 of the drain and capacitor 74. A node between signal line 73 and capacitor 74 is connected through the fundamental wave matching circuit 64 to signal output terminal 9. It should be noted that signal line 73 is the signal line between capacitor 71 and capacitor 74.

In a high frequency power amplifier thus comprised, the impedance Z3 of the resonance circuit comprising capacitor 71 having capacitance C3 and inductor 72 having inductance L3 to the third harmonic, and the impedance Z2 of the resonance circuit comprising capacitor 74 having capacitance C2 and inductor 75 having inductance L2 to the second harmonic, can be derived from the following equation (1)

$$Zi = j\omega Li + 1/(j\omega Ci) = (1 - \omega^2 LiCi)/(j\omega Ci) \quad (1)$$

where i=2 or 3 in this example and indicates the order of the harmonic.

Using the equation (1), the conditions needed for the resonance circuit comprising capacitor 71 and inductor 72 to resonate at the third harmonic, and the conditions needed for the resonance circuit comprising capacitor 74 and inductor 75 to resonate at the second harmonic, can be obtained. If inductances L2 and L3 are assumed to be 1.0 nH, the frequency f of the fundamental wave is 0.9 GHz, capacitance C3 for the third harmonic is 3.5 pF, and capacitance C2 for the second harmonic is 8.0 pF, $(1-\omega^2 LiCi)=0$, and the resonance circuits will resonate.

By thus adding a shunt capacitance C3 to the output terminal of the FET 2, the resonance circuits resonate at the third harmonic frequency 3f with inductor 72, a parasitic inductance of the capacitor 71 having capacitance C3. As a result, the output impedance ZL of the FET 2 to the third harmonic, that is, the impedance from the FET 2 to the output matching circuit 61, can be set to a sufficiently low desired value near the short circuit level. In addition, the line lengths of the drain bias line 65 and signal line 73 can be adjusted so that the output impedance ZL of the FET 2 to the second harmonic frequency 2f is a sufficiently high value near the open level.

It should be further noted that the impedance ZLC of the resonance circuit formed by capacitor 71 and inductor 72, and the resonance circuit formed by capacitor 74 and inductor 75, can be derived from the following equation (2) when $\omega = \omega i \pm \Delta \omega$.

$$ZLC = \{1 - (\omega i \pm \Delta \omega)^2 LiCi\} / \{j(\omega i \pm \Delta \omega)Ci\} \approx -(\pm 2\Delta \omega)/(j\omega iCi) \quad (2)$$

where i=1 or 2 and indicates the harmonic, and $\Delta \omega < \omega i$.

Figure 10:
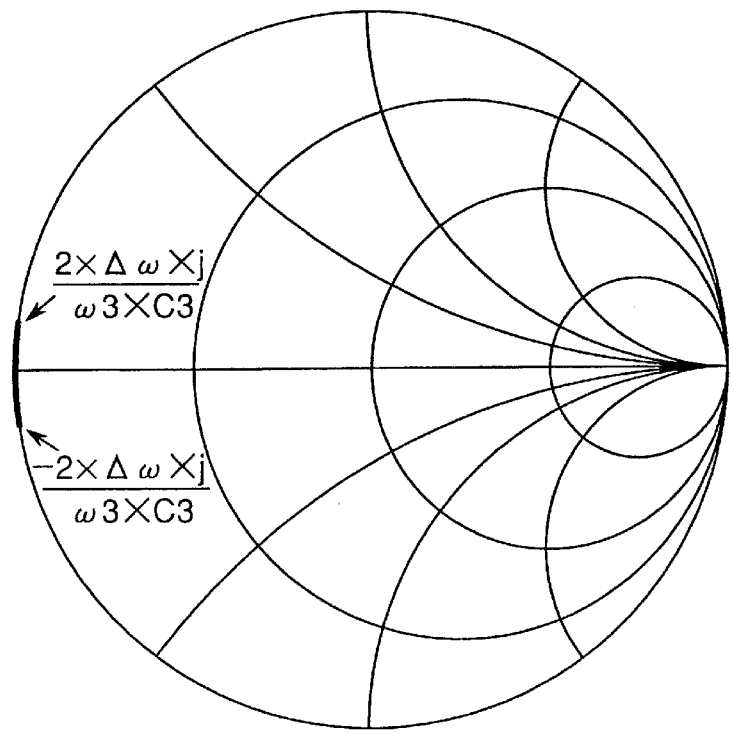
FIG. 10 is a Smith chart showing the impedance ZLC to the third harmonic in a resonant circuit formed by capacitor 71 and inductor 72 shown in FIG. 9.

FIG. 10 is a Smith chart showing the impedance ZLC to the third harmonic in the resonance circuit comprising capacitor 71 and inductor 72. As will be known from FIG. 10 and the equation (2), variation in impedance ZLC in the band $\omega i \pm \Delta \omega$ decreases as Ci increases, and impedance ZLC in the band $\omega i \pm \Delta \omega$ is in a desirably narrow impedance range. This means that the greater C3, the wider the band in which impedance ZLC to the third harmonic can be set to a high efficiency level.

When capacitor 71 and capacitor 74 are semiconductor chip devices, and the size of a common 1005 type chip is large, 1 mm by 0.5 mm, having a parasitic inductance of approximately 0.3 to 2.0 nH, inductance Li is 0.4 to 2.0 nH. However, in the resonance circuit of capacitor 71 and inductor 72, L3 must be decreased to increase C3 for the third harmonic because $L3 \times C3 = 1/\omega 3$.

Figure 11:
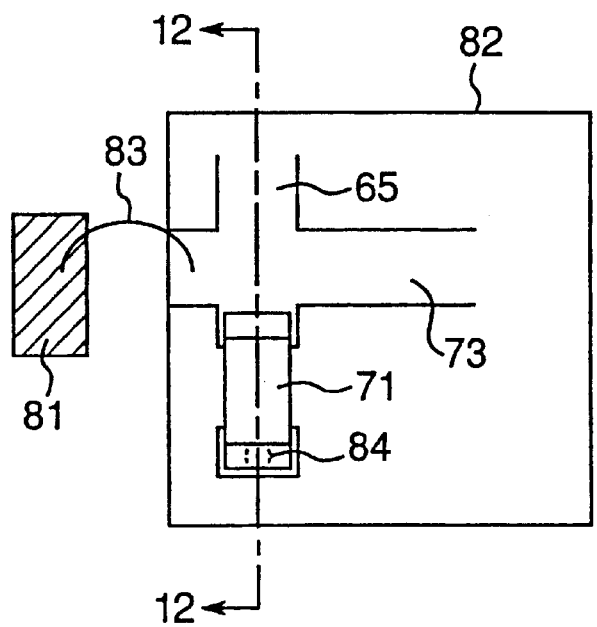
FIG. 11 is an illustration of a capacitor 71 mounting according to the second embodiment of the present invention.
Figure 12:
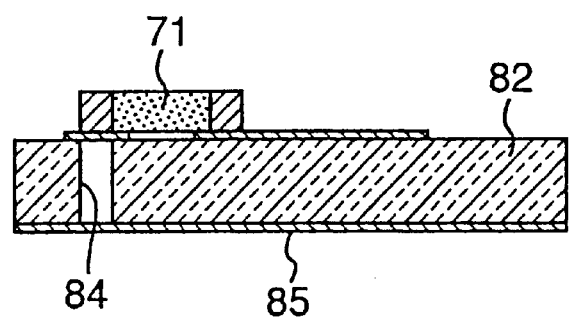
FIG. 12 is a sectional view along line 12—12 in FIG. 11.

FIG. 11 is an illustration of a typical capacitor 71 mounted according to the present invention, and FIG. 12 is a sectional view along line 12—12 of in FIG. 11. Note that FIG. 11 and FIG. 12 show the FET 2 and output matching circuit 61 mounted on different substrates.

In FIG. 11 and FIG. 12, FET 2 is a semiconductor device 81, output matching circuit 61 is located on a multiple layer matching substrate 82, and semiconductor device 81 and matching substrate 82 are electrically connected by a wire 83.

In the matching substrate 82, capacitor 71 is mounted in proximity to the node to which is connected wire 83, which is connected to the drain of FET 2 in the semiconductor device 81. An electrode of the capacitor 71 is connected to the wire 83. The node between capacitor 71 and wire 83 is connected to both the drain bias line 65 and signal line 73. It should be noted that to simplify the description, all connecting wires other than wire 83 between semiconductor device 81 and matching substrate 82 are omitted.

The other electrode of capacitor 71 is connected to a ground layer 85 on a back side of the matching substrate 82, that is, the side of the matching substrate 82 opposite that to which the capacitor 71 is mounted, through a via hole 84 located in proximity to the electrode. In a preferred embodiment, the via 84 is directly below the electrode. The ground layer 85 is grounded.

Figure 13:
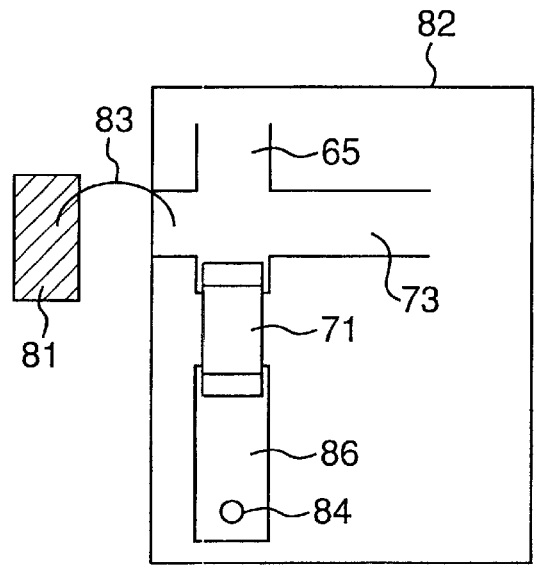
FIG. 13 is an illustration of a capacitor mounting according to the prior art.

It should be noted here that this method of mounting capacitor 71 differs from the conventional method. That is, capacitor 71 and via hole 84 are conventionally connected by a signal line 86 as shown in FIG. 13. As a result, inductance L3 cannot be reduced with this conventional method because the parasitic inductance of the signal line 86 is included in the inductance L3 of the inductor 72.

By thus mounting capacitor 71 as shown in FIG. 11 and FIG. 12, the signal line used for grounding the capacitor 71 can be shortened, and the parasitic inductance of the signal line can be reduced. As a result, the inductance L3 of the inductor 72 can also be reduced.

Figure 14:
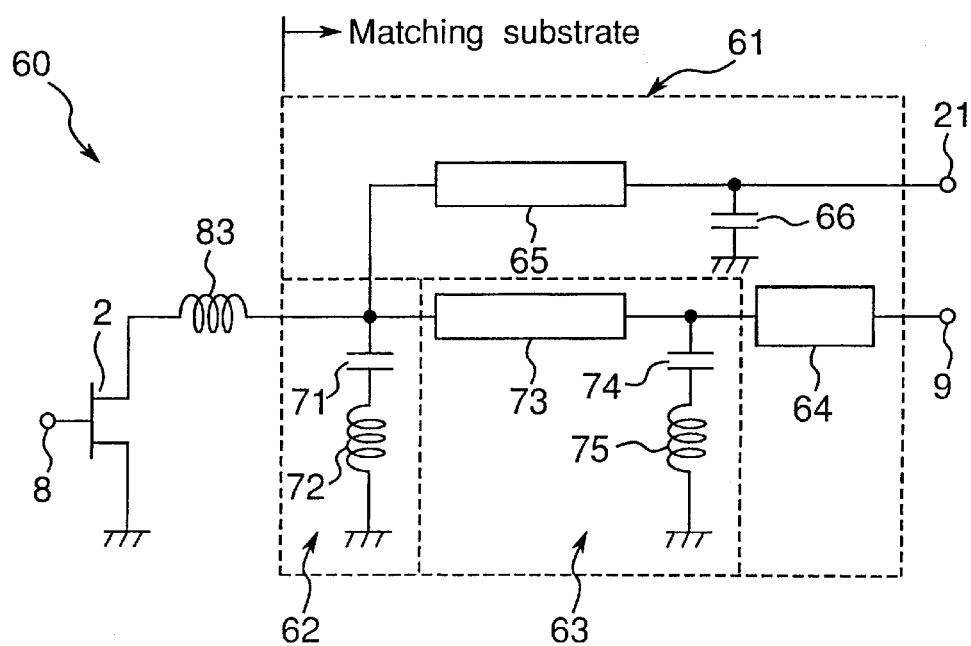
FIG. 14 is a circuit diagram of an alternative version of a high frequency power amplifier according to the second embodiment of the invention.

When the amplifier 60 is split between a semiconductor device 81 and matching substrate 82 as shown in FIGS. 11 and 12, the circuit diagram of the amplifier 60 shown in FIG. 9 will change as shown in FIG. 14. Note that the difference between the configurations shown in FIG. 9 and FIG. 14 is that in this case the drain of FET 2 is connected by means of a wire 83 to the drain bias line 65, capacitor 71, and signal line 73.

Figure 15:
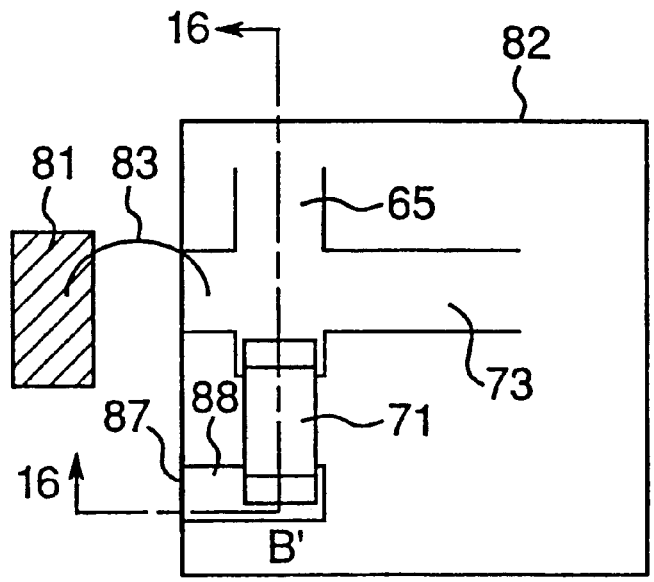
FIG. 15 is an illustration of a capacitor mounting according to a further version of the present invention.
Figure 16:
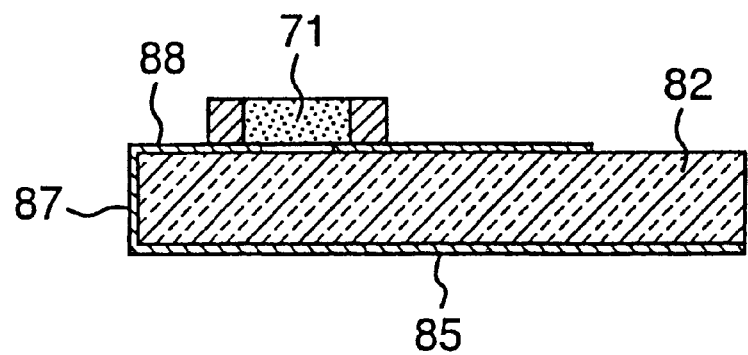
FIG. 16 is a section view along line 16—16 in FIG. 15.

A further method of mounting capacitor 71 according to the present invention is shown in FIG. 15 and FIG. 16, which is a sectional view along line 16—16 in FIG. 15. Note, further, that like parts are indicated by like reference numerals in FIGS. 15 and 16 and FIGS. 11 and 12, and repeated description thereof is thus omitted below, instead, only the differences are described.

In addition, FET 2 and output matching circuit 61 are also shown on separate substrates in FIGS. 15 and 16 by way of example. As in FIGS. 11 and 12, it should be noted that all connecting wires other than wire 83 between semiconductor device 81 and matching substrate 82 are omitted to simplify the following description.

The difference between FIGS. 11 and 12 and FIGS. 15 and 16 is that instead of using a via hole 84, a conductive layer ("side metallization" below) 87 on a side of the matching substrate 82 is used to connected a wiring pattern 88 to which an electrode of the capacitor 71 is connected to the ground layer 85. It should be further noted that the capacitor 71 in this case is mounted in proximity to the side metallization 87 so as to reduce the parasitic inductance of the wiring pattern 88 to an insignificantly low level.

This alternative mounting method thus makes it possible to shorten the signal line for grounding the capacitor 71 even when a via cannot be formed in the matching substrate 82. Parasitic inductance of the signal line can therefore again be reduced, and the inductance L3 of the inductor 72 can be reduced.

Figure 17:
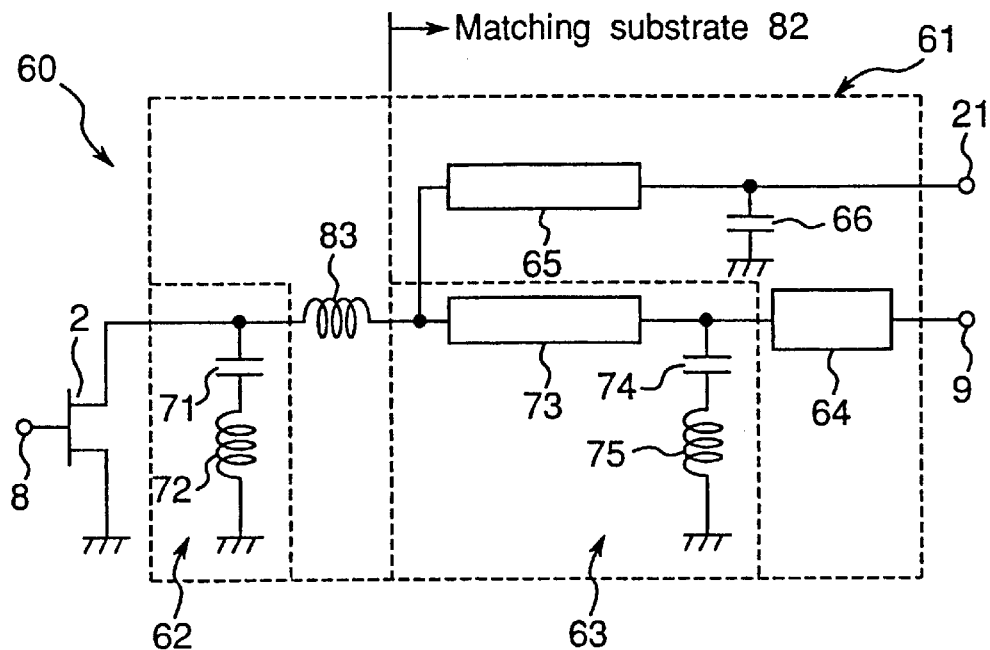
FIG. 17 is a circuit diagram of a further alternative version of a high frequency power amplifier according to the second embodiment of the invention.

It should be further noted that the capacitor 71 can be disposed to the same side as the semiconductor device 81, and a circuit diagram of the amplifier 60 shown in FIG. 14 for this case is shown in FIG. 17. The configuration shown in FIG. 17 differs from that in FIG. 14 in that the capacitor 71 is disposed in the semiconductor device 81 [NOTE: semiconductor device 81 is not shown in FIG. 17], and the third harmonic matching circuit 62 is therefore also disposed in the semiconductor device 81. The second harmonic matching circuit 63, fundamental wave matching circuit 64, drain bias line 65, and capacitor 66 are disposed on the matching substrate 82, and wire 83 contained in the output matching circuit 61 connects the third harmonic matching circuit 62 in the semiconductor device 81 to the output matching circuit 61 and second harmonic matching circuit 63 on the matching substrate 82.

Figure 18:
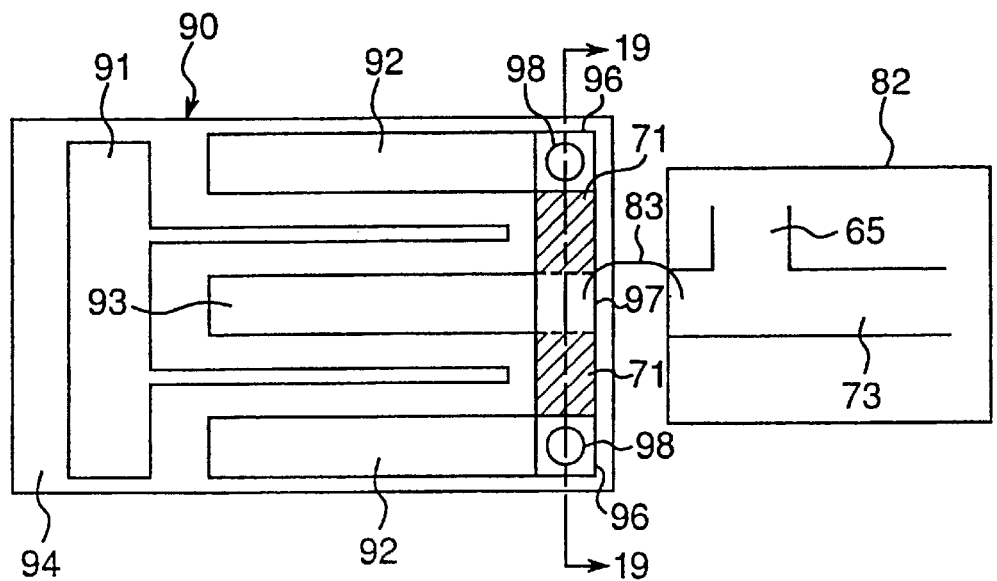
FIG. 18 shows a semiconductor device comprising a capacitor as shown in FIG. 17.
Figure 19:
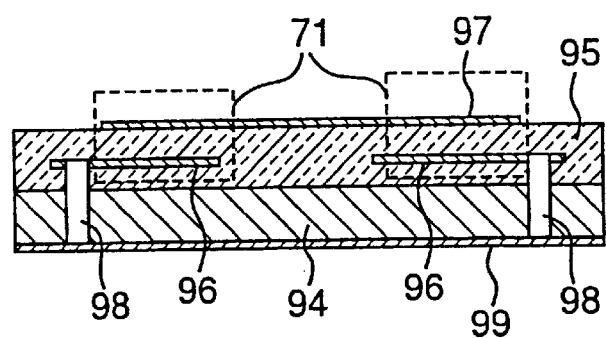
FIG. 19 is a side section view along line 19—19 in FIG. 18.

FIG. 18 is a diagram of a semiconductor device in which the capacitor 71 is formed, and FIG. 19 is a sectional view along line 19—19 in FIG. 18. Note that like parts are indicated by like reference numerals in FIGS. 18 and 19 and FIGS. 11 and 12, and repeated description thereof is thus omitted below, instead only the differences are described.

In addition, FET 2 and output matching circuit 61 are also shown on separate substrates in FIGS. 18 and 19 by way of example. As in FIGS. 11 and 12, it should be noted that all connecting wires other than wire 83 between semiconductor device 90 and matching substrate 82 are omitted to simplify the following description.

As shown in FIGS. 18 and 19, semiconductor device 90 comprises an FET 2 having a comb-shaped gate electrode 91, source electrode 92, and drain electrode 93, and a metal-insulator-metal (MIM) capacitor 71, on a semiconductor substrate 94. An insulating layer 95 is formed on the semiconductor substrate 94. The capacitor 71 comprises electrodes 96 in the insulating layer 95 and electrode 97 on the insulating layer 95 with the insulation layer 95 separating the electrodes 96 and electrode 97 in an MIM structure. The insulating layer 95 between the electrode 97 and each of the electrodes 96 acts as a dielectric of the capacitor 71.

Each of the electrodes 96 is connected to a ground electrode 99 on a back side of the semiconductor substrate 94, that is, the side of the substrate 94 opposite that to which the capacitor 71 is formed, through a via 98 corresponding to each electrode 96. The ground electrode 99 is grounded. Electrode 97 is connected to drain bias line 65 and signal line 73 of the matching substrate 82 by means of wire 83.

A high frequency power amplifier according to this version of the present invention can thus be made smaller compared with an amplifier using a chip-type capacitor. The parasitic inductance of the capacitor 71 can therefore be reduced, the capacitance of the capacitor 71 increased, and a high frequency power amplifier with high power amplification efficiency over a wide band can therefore be achieved.

Figure 20:
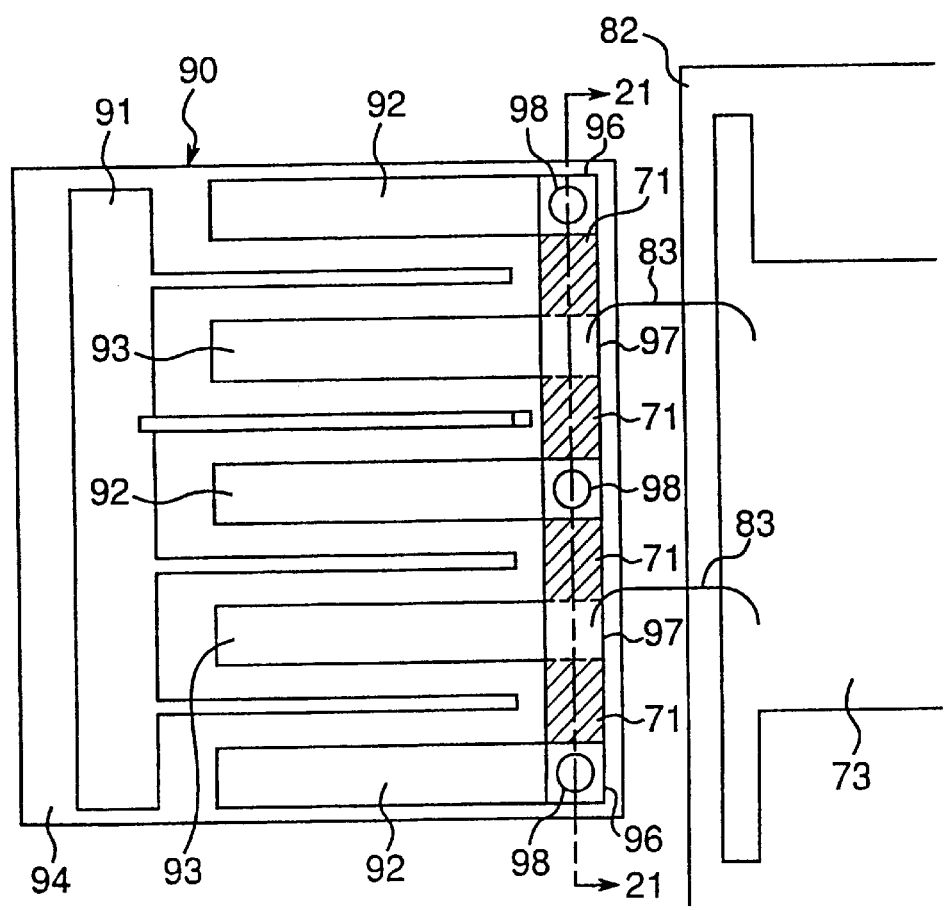
FIG. 20 is an illustration of a semiconductor device comprising a plurality of FETs according to the present invention.
Figure 21:
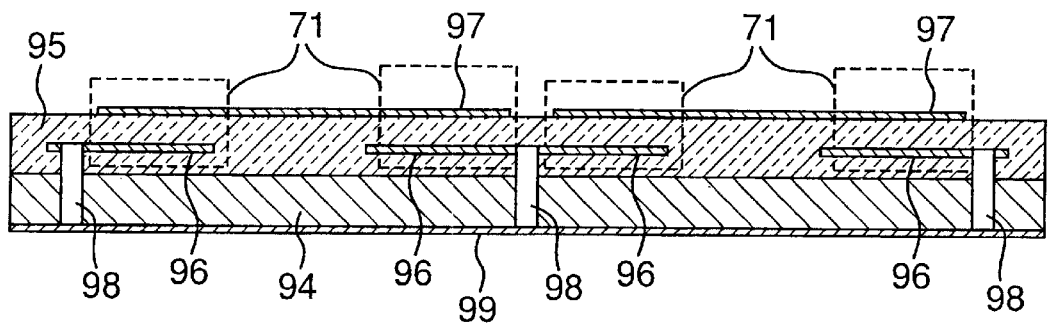
FIG. 21 is a section view along line 21—21 in FIG. 20.

It will also be obvious to one with ordinary skill in the related art that while the semiconductor device 90 is shown by way of example only with one FET in FIG. 18 and FIG. 19, the invention is not be so limited. More specifically, the semiconductor device 90 can be alternatively constructed with a plurality of FETs as shown in FIG. 20 and FIG. 21, which is a sectional view along line 21—21 in FIG. 20. Note that like parts are indicated by like reference numerals in FIGS. 20 and 21 and FIGS. 18 and 19. The description of FIGS. 20 and 21 and FIGS. 18 and 19 is also the same, and further description thereof is thus omitted below.

In addition, the amplifier in FIGS. 20 and 21 is shown comprising only two FETs by way of example only. Furthermore, as in FIGS. 11 and 12, it should be noted that all connecting wires other than wire 83 between semiconductor device 90 and semiconductor device 90 are omitted.

As shown in FIGS. 20 and 21, by providing a resonance circuit that resonates at the frequency 3f of the third harmonic to each drain electrode 93, phase shift of the output impedance ZL to the third harmonic due to the wire 83 can be eliminated in each FET cell. Compared with a design in which a single resonance circuit that resonates at the frequency 3f of the third harmonic is provided for the matching substrate as a whole, the phase of the output impedance ZL to the third harmonic can be made uniform in each FET cell, and reflection of the third harmonic loss component from each wire 83 can be increased. As a result, parasitic inductance of the inductor 72 in the third harmonic matching circuit 62 can be reduced, operation over a wide bandwidth is possible due to greater capacitor 71 capacitance, and higher efficiency amplifier circuit characteristics can be achieved.

The third harmonic matching circuit 62 of the amplifier 60 shown in FIG. 9 is also shown comprising only one resonance circuit from capacitor 71 and inductor 72, but the third harmonic matching circuit 62 can alternatively comprise a plurality of resonance circuits connected in parallel. By thus comprising third harmonic matching circuit 62 with n parallel connected resonance circuits each having a capacitor 71 and inductor 72, the inductance L3 of a third harmonic matching circuit 62 having only one resonance circuit is reduced to 1/n, and the capacitance C3 is increased 3n times, thereby enabling high efficiency operation over a wider band.

Furthermore, efficiency is not degraded if the inductance L2 of inductor 75 in the second harmonic matching circuit 63 is greater than the inductance L3 of inductor 72 in the third harmonic matching circuit 62 because the high efficiency area of the second harmonic in the second harmonic matching circuit 63 is wider than that of the third harmonic as shown in FIG. 5. The output impedance ZL of the FET 2 to the fundamental wave can therefore be easily set to a desired value by increasing inductance L2 under the condition that $L2 \times C2 = 1/(2\pi x\ 2f)^2$.

Figure 22:
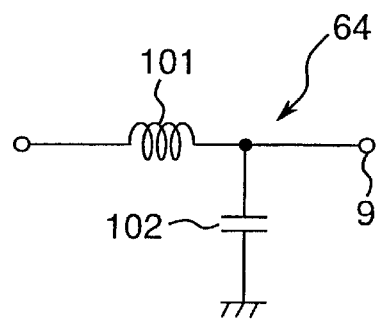
FIG. 22 is a circuit diagram of the fundamental wave matching circuit shown in FIG. 9.

FIG. 22 is a circuit diagram of the fundamental wave matching circuit 64 shown in FIG. 9. As shown in FIG. 22, the fundamental wave matching circuit 64 comprises an inductor 101 with inductance Lout, and a capacitor 102 with capacitance Cout, with inductor 101 and capacitor 102 forming a low pass filter. The inductor 101 is connected between the signal output terminal 9 and a node between signal line 73 and capacitor 74, and capacitor 102 is connected of ground and a node between inductor 101 and signal output terminal 9.

Figure 23:
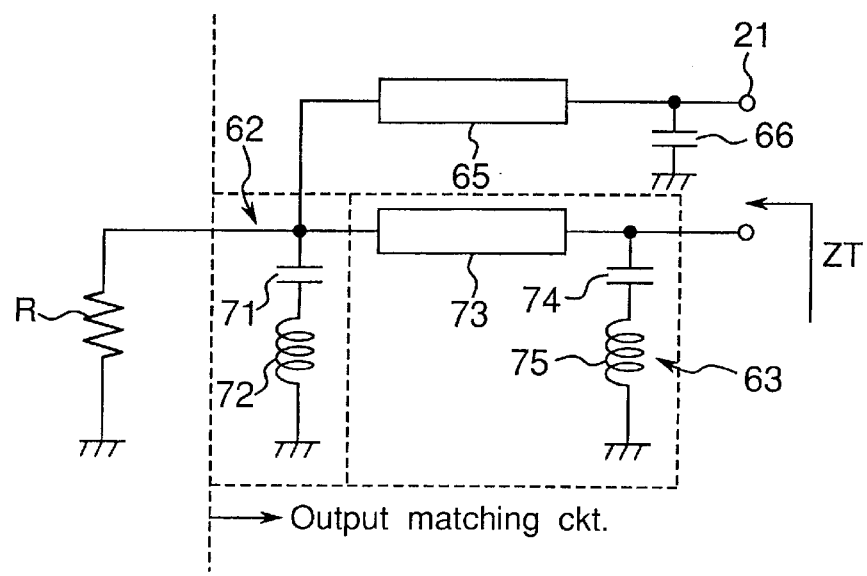
FIG. 23 is a diagram of the circuit to the end of second harmonic matching circuit when the output impedance R of an FET is 7 Ω.
Figure 24:
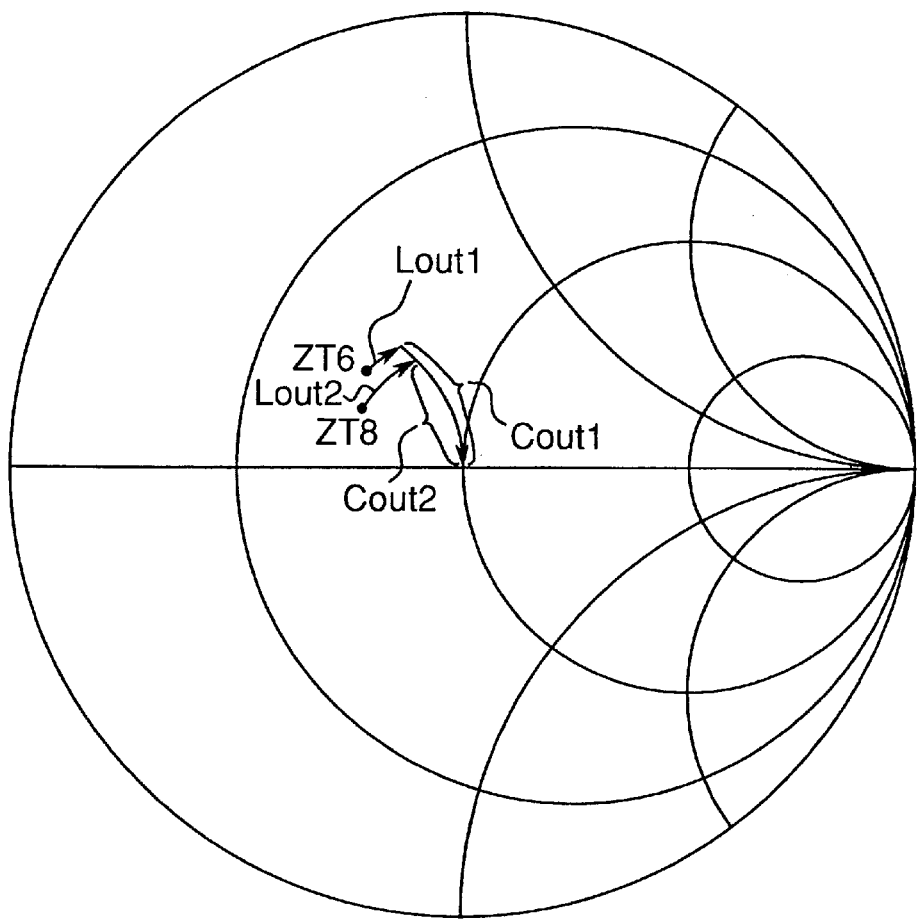
FIG. 24 is a Smith chart showing the computed results of impedance ZT to fundamental wave f when an FET is observed from the end of second harmonic matching circuit shown in FIG. 23.

FIG. 23 is a diagram of the circuit to the output of second harmonic matching circuit 63 when the output impedance R of the FET 2 is 7 Ω. FIG. 24 is a Smith chart showing the calculated results of impedance ZT to the fundamental wave at the output side of the second harmonic matching circuit 63 shown in FIG. 23, that is, from the node between signal line 73 and capacitor 74 to FET 2, when the fundamental wave matching circuit 64 shown in FIG. 22 is used. In FIG. 24, ZT6 indicates the impedance ZT at the output of second harmonic matching circuit 63 when C2=6 pF, and ZT8 indicates the impedance ZT when C2=8 pF.

To set the output impedance of the amplifier 60 to 50 Ω (center of the Smith chart), the inductor 101 must be set to inductance Lout1 and the capacitor 102 to capacitance Cout1 for ZT6, and to inductance Lout2 and capacitance Cout2, respectively, for ZT8. As will be known from FIG. 24, inductance Lout decreases as C2 decreases. As a result, the line length of inductor 101 can be shortened as the capacitance C2 of capacitor 74 is reduced, and the area occupied by the fundamental wave matching circuit 64 on the matching substrate 82 can be reduced.

Capacitance C2 can be selected to enable easy fundamental wave matching without degrading efficiency because the high efficiency range of the second harmonic is wide even when the capacitance C2 of the capacitor 74 is low. Amplifier 60 matching can also be made easier by setting the inductance L2 of inductor 75 greater than the inductance L3 of inductor 72.

Figure 25:
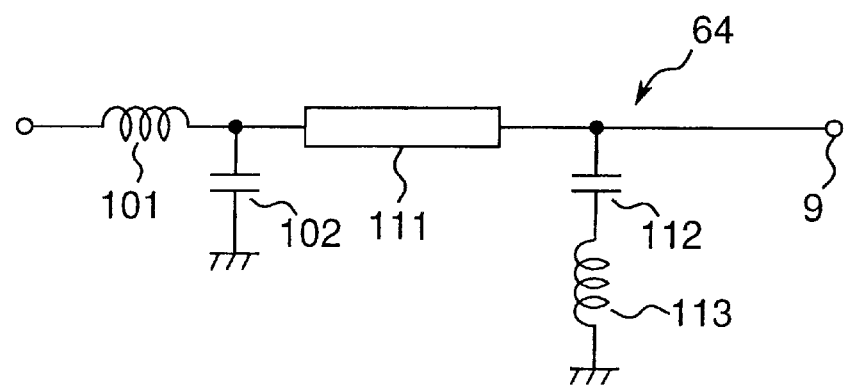
FIG. 25 is a circuit diagram of an alternative version of the fundamental wave matching circuit shown in FIG. 9.
Figure 26:
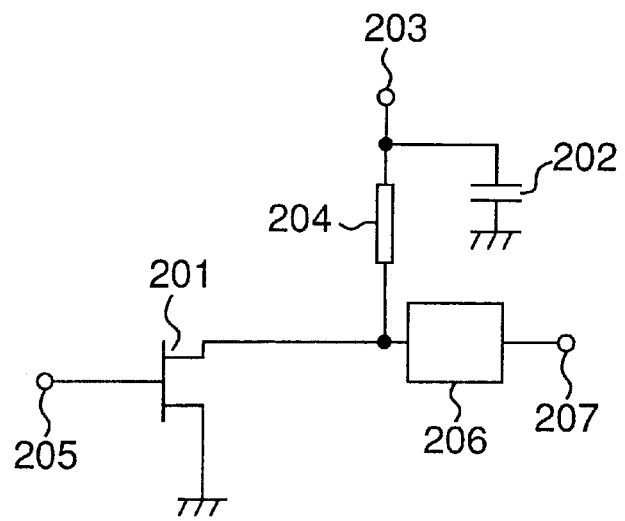
FIG. 26 is a circuit diagram of a B-class amplifier according to the prior art.
Figure 27:
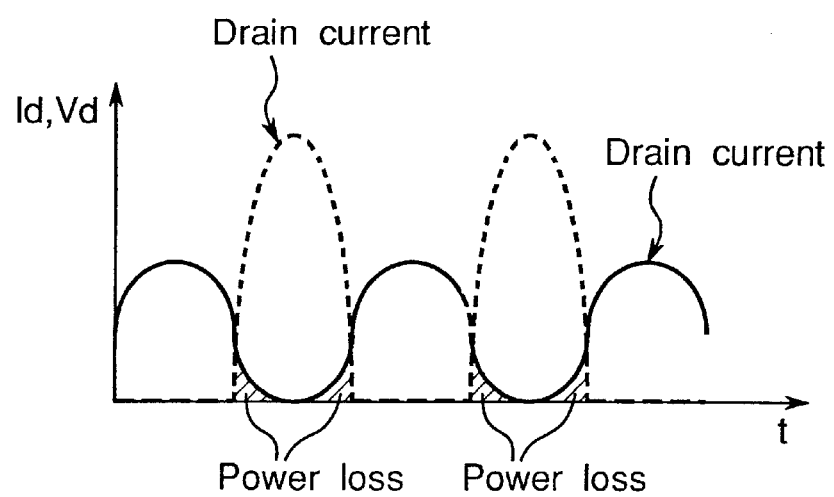
FIG. 27 is a waveform diagram of the drain current and drain voltage in the FET 201 shown in FIG. 26.

FIG. 25 is a circuit diagram of the fundamental wave matching circuit 64 according to another version of the present invention. Note that like parts are indicated by like reference numerals in FIG. 25 and FIG. 22, and further description thereof is thus omitted below, where only the differences to FIG. 22 are described.

As will be known from FIG. 25, a fundamental wave matching circuit 64 according to this version additionally comprises signal line 111, capacitor 112, and inductor 113. The inductor 101 and capacitor 102 of this fundamental wave matching circuit 64 thus form a low pass filter, and capacitor 112 and inductor 113 form a resonance circuit. A node of inductor 101 and capacitor 102 is connected through signal line 111 to signal output terminal 9, and capacitor 112 and inductor 113 are connected in series between ground and the signal output terminal 9.

Thus comprised, the fundamental wave matching circuit 64 can be made to reflect all resonance frequencies by setting the capacitor 112 and inductor 113 to resonate at the second harmonic and third harmonic, and matching the fundamental wave. As a result, harmonics that could not be completely reflected due to variation in the capacitors 71 and 74 and inductors 72 and 75 can be reliably reflected, and the level of harmonics leaving the amplifier 60 can be reduced.

As described above, a high frequency power amplifier according to this second embodiment of the present invention comprises an output matching circuit 61 having a third harmonic matching circuit 62 comprising at least one resonance circuit, a second harmonic matching circuit 63 comprising a signal line 73 and a resonance circuit, a fundamental wave matching circuit 64 comprising a low pass filter, a drain bias line 65, and a capacitor 66. The resonance circuit of the third harmonic matching circuit 62 is set to resonate at the frequency 3f of the third harmonic so that the output impedance ZL of the FET 2 to the third harmonic is a sufficiently low value near the short circuit level. In addition, the signal line lengths of the drain bias line 65 and signal line 73 are adjusted so that the resonance circuit of the second harmonic matching circuit 63 resonates at the frequency 2f of the second harmonic so that the output impedance ZL of the FET 2 to the second harmonic is a sufficiently high value near the open circuit level. As a result, power loss can be reduced while also improving efficiency.

Although the present invention has been described in connection with the preferred embodiments thereof with reference to the accompanying drawings, it is to be noted that various changes and modifications will be apparent to those skilled in the art. For example, the odd harmonic matching circuit for impedance matching to odd harmonics is described in the above preferred embodiments of the invention using the third harmonic, and the even harmonic matching circuit for impedance matching to even harmonics is described using the second harmonic by way of example only, and the present invention shall not be limited thereto.

Furthermore, the above preferred embodiments of the invention are described using an FET by way of example only, but the present invention shall not be so limited. Specifically, a bipolar transistor can be used in place of a FET.

Such changes and modifications are to be understood as included within the scope of the present invention as defined by the appended claims, unless they depart therefrom.

What is claimed is:

1. A high frequency power amplifier for amplifying a high frequency comprising:
    an amplifier element for amplifying a high frequency signal; and
    an output matching circuit for impedance matching an amplified high frequency signal output from an output terminal of said amplifier element and comprising
        an odd harmonic matching circuit providing a short circuit load to at least one odd harmonic of the amplified high frequency signal and including a bias line for supplying a bias voltage from an external source to said output terminal of said amplifier element, said bias line having a length so that a phase angle of the odd harmonic has a predetermined value,
        an even harmonic matching circuit providing an open circuit to at least one even harmonic of the amplified high frequency signal, and
        a fundamental wave matching circuit for impedance matching a fundamental wave of the amplified high frequency signal, wherein said matching circuits are connected to the output terminal of said amplifier element in series from the highest order of harmonic to be impedance matched.

2. The high frequency power amplifier according to claim 1, further comprising an input matching circuit for impedance matching a high frequency signal input to an input terminal of said amplifier element, wherein a reflection coefficient observed from the input terminal of said amplifier element to said input matching circuit is set so that a phase angle of the fundamental wave is within +5° to −75° of a phase angle at which maximum gain is obtained.

3. The high frequency power amplifier according to claim 1, wherein said output impedance matching circuit impedance matches to each harmonic in sequence from a high order harmonic of the high frequency signal amplified by the amplifier element.

4. The high frequency power amplifier according to claim 1, wherein a reflection coefficient of said odd harmonic matching circuit observed from said output terminal of said amplifier element to said output matching circuit is set so that the phase angle of the odd harmonic is in a range of 160° to 220°.

5. The high frequency power amplifier according to claim 1, wherein said odd harmonic matching circuit comprises a first resonant circuit including a capacitor and parasitic inductor wherein said first resonant circuit resonates at a frequency of the odd harmonic to be impedance matched.

6. The high frequency power amplifier according to claim 5, wherein said even harmonic matching circuit comprises a second resonant circuit including a capacitor and parasitic inductor, said second resonant circuit resonating at a frequency of the even harmonic to be impedance matched, and a signal line for connecting said second resonant circuit and said odd harmonic matching circuit.

7. The high frequency power amplifier according to claim 6, wherein
    said output matching circuit further comprises a bias line for supplying a bias voltage from an external source to said output terminal of said amplifier element, and
    said bias line and said signal line of said even harmonic matching circuit have lengths so the output impedance of said amplifier element to the even harmonic is an open circuit of high impedance, said output impedance of said amplifier element being an impedance observed from said amplifier element to said output matching circuit.

8. The high frequency power amplifier according to claim 6, wherein the inductance of the parasitic inductor of said second resonant circuit in said even harmonic matching circuit is greater than the inductance of the parasitic inductor of said first resonant circuit in said odd harmonic matching circuit.

9. The high frequency power amplifier according to claim 7, wherein the inductance of the parasitic inductor of said second resonant circuit in said even harmonic matching circuit is greater than the inductance of the parasitic inductor of said first resonant circuit in said odd harmonic matching circuit.

10. The high frequency power amplifier according to claim 5, including a semiconductor substrate and a multiple layer matching substrate having a ground electrode layer, wherein
    said amplifier element is disposed on said semiconductor substrate,
    said output matching circuit is disposed on said multiple layer matching substrate, and
    said capacitor of said first resonant circuit is connected to said ground electrode layer of said multiple layer matching substrate through a via hole.

11. The high frequency power amplifier according to claim 5, including a semiconductor substrate and a multiple layer matching substrate having a ground electrode layer having a conductor layer on a side surface wherein
    said amplifier element is disposed on said semiconductor substrate,
    said output matching circuit is disposed on said multiple layer matching substrate, and
    said capacitor of said first resonant circuit is connected to said ground electrode layer of said multiple layer matching substrate by means of said conductor layer on said matching substrate.

12. The high frequency power amplifier according to claim 5, including a semiconductor substrate wherein said capacitor of said first resonant circuit and said amplifier element are located on said semiconductor substrate.

13. The high frequency power amplifier according to claim 6, wherein said fundamental wave matching circuit comprises a low pass filter.

14. The high frequency power amplifier according to claim 6, wherein said fundamental wave matching circuit comprises a low pass filter and a third resonant circuit, said resonance circuit resonating at a frequency of one of the even and odd harmonics.

15. The high frequency power amplifier according to claim 1, wherein the even harmonic is a second harmonic, and the odd harmonic is a third harmonic.

16. A high frequency power amplifier for amplifying a high frequency comprising:
    an amplifier element for amplifying a high frequency signal; and
    an output matching circuit for impedance matching an amplifying high frequency signal output from an output terminal of said amplifier element and comprising
        an odd harmonic matching circuit providing a short circuit load to at least one odd harmonic of the amplified high frequency signal, an even harmonic matching circuit providing an open circuit to at least one even harmonic of the amplified high frequency signal, a first low pass filter connected between said odd harmonic matching circuit and even harmonic matching circuit, a fundamental wave matching circuit for impedance matching a fundamental wave of the amplified high frequency signal, and a second low pass filter connected between said even harmonic matching circuit and said fundamental wave matching circuit, wherein said matching circuits are connected to the output terminal of said amplifier element in series from the highest order of harmonic to be impedance matched.

17. The high frequency power amplifier according to claim 16, further comprising an input matching circuit for impedance matching a high frequency signal input to an input terminal of said amplifier element, wherein a reflection coefficient observed from the input terminal of said amplifier element to said input matching circuit is set so that a phase angle of the fundamental wave is within +5° to −75° of a phase angle at which maximum gain is obtained.

18. The high frequency power amplifier according to claim 16, wherein said output impedance matching circuit impedance matches to each harmonic in sequence from a high order harmonic of the high frequency signal amplified by the amplifier element.

19. The high frequency power amplifier according to claim 16, wherein said odd harmonic matching circuit comprises a first resonance circuit including a capacitor and parasitic inductor wherein said first resonant circuit resonates at a frequency of the odd harmonic to be impedance matched.

20. The high frequency power amplifier according to claim 19, wherein said even harmonic matching circuit comprises a second resonance circuit including a capacitor and parasitic inductor wherein said second resonance circuit resonates at a frequency of the even harmonic to be impedance matched, and a signal line for connecting said second resonance circuit and said odd harmonic matching circuit.

* * * * *